United States Patent
Kamata (10) Patent No.: US 6,617,907 B2
(45) Date of Patent: Sep. 9, 2003

(54) VOLTAGE TRANSLATOR

(75) Inventor: Yoshihiko Kamata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/078,356

(22) Filed: Feb. 21, 2002

(65) Prior Publication Data

US 2003/0052725 A1 Mar. 20, 2003

(30) Foreign Application Priority Data

Sep. 20, 2001 (JP) ........................................ 2001-286904

(51) Int. Cl.[7] ............................................... H03L 5/00
(52) U.S. Cl. ........................... 327/333; 327/112; 326/81
(58) Field of Search ................................. 327/112, 333, 327/427, 108; 326/68, 80, 81, 83; 365/185.23, 230.06

(56) References Cited

U.S. PATENT DOCUMENTS 5,455,789 A * 10/1995 Nakamura et al. ...... 365/185.17
6,066,975 A * 5/2000 Matano ....................... 327/333
6,259,631 B1 * 7/2001 Menichelli et al. ..... 365/185.23

FOREIGN PATENT DOCUMENTS

EP          0 829 881 A2    3/1998

* cited by examiner

Primary Examiner—Terry D. Cunningham
Assistant Examiner—Long Nguyen
(74) Attorney, Agent, or Firm—Volentine Francos, PLLC (57) ABSTRACT

A voltage translator enabling a high speed non-selection switching with regard to the word line voltage. The voltage translator (10) includes one inverter (made up of transistors N1 and P1) arranged on the output side of the voltage transistor circuit, a feedback PMOS type transistor (P2), an NMOS type transistor (N4) having a earth terminal and controlled by the output signal from the other inverter newly added on the input side of the voltage translator circuit, an NMOS type transistor (N3) controlled by the word line, and a PMOS type transistor (P3) controlled by a signal given through an NOMS transistor (N2) connected with the output of the above newly added inverter located on the input side of the voltage translator circuit.

15 Claims, 9 Drawing Sheets

VOLTAGE TRANSLATOR

BACKGROUND OF THE INVENTION

1. Field of the Invention

The present invention relates to a voltage translator capable of switching a supply voltage at a high speed in a semiconductor integrated circuit.

2. Related Art

There is a case where a plurality of voltages having different values are used inside the semiconductor integrated circuit. In case of a currently available flash electrically erasable and programmable read-only memory (flash EEPROM), for instance, the voltage of about 5V is applied to a word line selected to read the data therefrom while the other word lines not selected are made to be at the ground (earth) potential. On one hand, in the other logical circuits like a decoder and so forth, the voltage of about 3V is used as a power source voltage. Here, the above voltage values are not definitive but only illustrative, and would be variable depending on the future improvement and development of the semiconductor manufacturing process.

Figure 9:
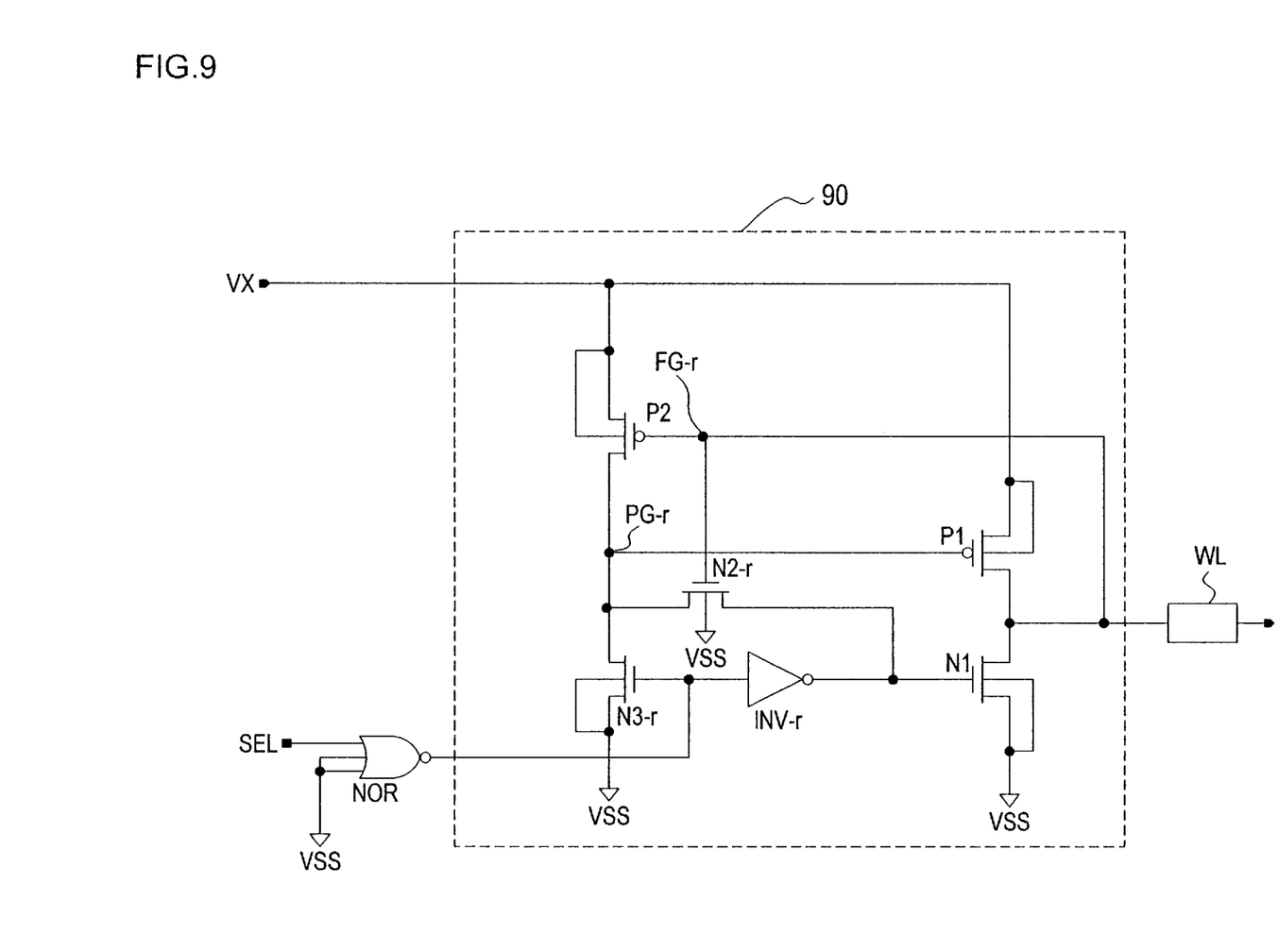
FIG. 9 is a circuit diagram of a prior art voltage translator.

In order to execute the high speed data read, it is required to speedily vary the word line voltage in response to the selection signal of the word line. A circuit having the function capable of meeting this requirement is called a "Voltage Translator." One of circuits of this kind has been disclosed by the Japanese Patent Publication No. 10-149693. FIG. 9 of the drawings attached hereto shows the circuit diagram of the prior art voltage translator 90 disclosed by the above patent publication. The voltage translator 90 is arranged such that the word line is connected, on one hand, with the earth VSS through the first NMOS type switching transistor N1 while it is connected, on the other hand, with an operation power source VX through the first PMOS type switching transistor P1. Furthermore, this voltage translator 90 includes the first PMOS type feedback transistor P2 put in such a state that it is directly driven by the voltage level of the word line, and the second NMOS type feedback transistor N2-r put in such a state that it is directly driven by the voltage level of the word line. In the circuit arrangement like this, the turn-on of the first NMOS type switching transistor N1 and the turn-off of the first PMOS type switching transistor P1 are accelerated by making use of the on/off of the second NMOS type feedback transistor N2-r, thereby realizing the high speed changeover of the word line voltage.

Each gate of transistors N1, N2-r, N3-r, P1, and P2 as shown in FIG. 9 has an equal gate length of 1.4 $\mu$m while each gate of the same has correspondingly the gate width of 50 $\mu$m, 6 $\mu$m, 20 $\mu$m, 40 $\mu$m, and 4 $\mu$m. Each gate of the PMOS type transistor and the NMOS transistor which constitute a decoder NOR and also an inverter INV-r, has the gate width of 15 $\mu$m and 3 $\mu$m in case of the decoder NOR while 10 $\mu$m and 3 $\mu$m in case of the inverter INV-r. In FIG. 9, a plurality of actual word lines are represented in a lump by a word line model illustrated in the form of a rectangular box (WL) by taking account of their floating capacity and others.

It takes 7 ns or so to apply the high voltage adopted by the circuit disclosed in the above patent publication to the selected word line, so that the process of increasing the voltage of the selected word line can be carried out at a high speed. On one hand, however, it takes 10 ns or so to reduce the high voltage applied to the selected word line to the lower voltage, so that the process of reducing the voltage applied to the selected word line is carried out at a slower speed, comparing with the above process of increasing the voltage of the selected word line.

If a plurality of such prior art voltage translators as describe above are used for the word line driving circuit of a semiconductor memory device, it becomes necessary to avoid the duplicated selection of the word line.

Accordingly, as described in the above, the switching operation for memory selection can not help being restricted by the non-selection switching time.

Consequently, in order to realize a more speedy memory read operation, it has been desired to develop a voltage translator having a more speedy non-selection switching time characteristic. Therefore, the invention has been made for the purpose of providing a novel and improved voltage translator having such a desired characteristic as described above.

SUMMARY OF THE INVENTION

Accordingly, in order to achieve the above object, the invention provides a voltage translator capable of supplying the operation voltage or a low voltage to the word line based on a decode signal. This voltage translator is characterized in that it is provided with an inverter, the first, third and fourth NMOS type transistors, and the first, second and third PMOS type transistors.

The inverter generates a logical selection signal based on the decode signal.

The first NMOS type transistor (N1) is provided with a source electrode connected with the low voltage source, a drain electrode connected with the word line, and a gate electrode connected with the output terminal of the inverter.

The first PMOS type transistor (P1) is provided with a source electrode connected with the operation voltage source and a drain electrode connected with the word line.

The second PMOS type transistor (P2) is provided with a source electrode connected with the operation voltage source and a drain electrode connected with the gate of the first PMOS type transistor.

The third NMOS type transistor (N3) is provided with a source electrode connected with the gate electrode of the second PMOS type transistor, a drain electrode connected with the operation voltage source, and a gate electrode connected with the word line.

The third PMOS type transistor (P3) is provided with a source electrode connected with the gate electrode of the second PMOS type transistor and with the source electrode of the third NMOS transistor, a drain electrode connected with the word line, and a gate electrode connected with the gate electrode of the first PMOS type transistor.

The fourth NMOS type transistor (N4) is provided with a source electrode connected with the low voltage source, a drain electrode connected with the gate electrode of the second PMOS type transistor, and a gate electrode connected with the output terminal of the inverter.

The second PMOS type transistor functions as a feedback transistor in the voltage translator. With the circuit arrangement as described above, it becomes possible to drive the operation voltage by means of the logical control voltage. Still further, with this circuit arrangement, as the response of the feedback path transmitting the word line voltage to the gate electrode of the second PMOS type transistor is made faster, the voltage of the word line is speedily changed to the low voltage level in the switching process from the selection to the non-selection process, thereby the speedy nonselection switching becoming possible. As a result, the voltage of the word line can be speedily reduced to the low voltage level.

Some preferred embodiments of the invention will now be described in detail in the following, with reference to the accompanying drawings. The numerical values as used for expressing time, length, width and so forth in the following description are not definitive but illustrative to the last.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

In the following detailed description of the invention, the process of increasing the voltage of the selected word line and the time needed therefor are referred to as "the selection process" and "the selection switching time" hereinafter, respectively. On one hand, the process of reducing the voltage applied to the selected word line and the time needed therefor are referred to as "the non-selection process" and "the non-selection switching time hereinafter," respectively.

[First Embodiment]

(Constitution)

Figure 1:
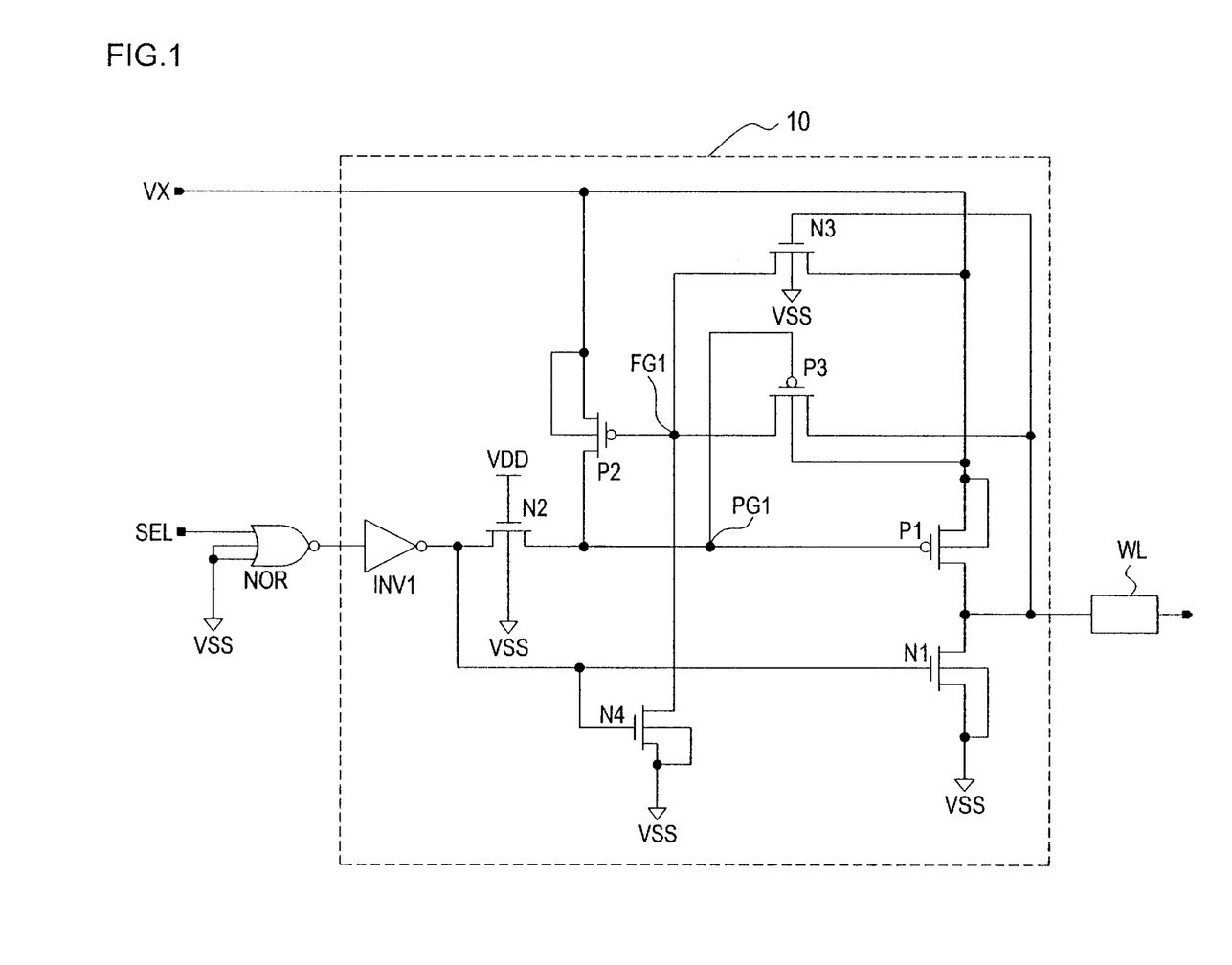
FIG. 1 is a circuit diagram of a voltage translator according to the first embodiment of the invention.

FIG. 1 is a circuit diagram of a voltage translator arranged according to the first preferred embodiment of the invention.

A voltage translator 10 is connected with an operation voltage source VX generating the high voltage and also with a low voltage source VSS generating the lower voltage, and supplies either the high voltage or the lower one to the word line WL. Changeover from the selection process to the non-selection process or vice versa is carried out by means of a decode signal SEL. The decode signal SEL is inputted to the voltage translator 10 through a decoder typically shown in the form of a NOR gate NOR in FIG. 1.

The output terminal of the decoder NOR is connected with the input terminal of an inverter INV1. The decode signal SEL has the inverter INV1 generated a logical selection signal at the output terminal thereof.

This logical selection signal is inputted to the gate electrode of the first NMOS type transistor (referred to as "the first N-type transistor" hereinafter) N1, of which the source and drain electrodes are connected with the low voltage source VSS and the word line WL, respectively. The second NMOS type transistor (referred to as "the second N-type transistor" hereinafter) N2 includes a source electrode connected with the output terminal of the inverter INV1, a drain electrode connected with the gate electrode of the first PMOS type transistor (referred to as "the first P-type transistor" hereinafter) P1 which will be described later, and a gate electrode connected with a logical control voltage source VDD.

Furthermore, the word line WL is connected with the low voltage source VSS via the first N-type transistor N1, and is also connected with the operation voltage source VX via the first P-type transistor P1. In other words, the drain electrode of the first P-type transistor Pt is connected with the word line WL while the source electrode of the same is connected with the operation voltage source VX.

Here, a junction point made by the drain electrode of the second N-type transistor N2 and the gate electrode of the first P-type transistor P1 is referred to as "the first connection node" and is indicated with a reference mark 'PG1' in FIG. 1.

The second PMOS type transistor (referred to as "the second P-type transistor" hereinafter) P2 includes a source electrode connected with the operation voltage source VX and a drain electrode connected with the first connection node PG1.

The third NMOS type transistor (referred to as "the third N-type transistor" hereinafter) N3 includes a source electrode connected with the gate electrode of the second P-type transistor P2, a drain electrode connected with the operation voltage source VX, and a gate electrode connected with the word line WL.

Here again, a junction point made by the gate electrode of the second P-type transistor P2 and the source electrode of the third N-type transistor N3 is referred to as "the second connection node" and is indicated with a reference mark 'FG1' in FIG. 1.

The third PMOS type transistor (referred to as "the third P-type transistor" hereinafter) P3 includes a source electrode connected with the second connection node FG1, a drain electrode connected with the word line WL, and a gate electrode connected with the first connection node PG1.

The fourth NMOS type transistor (referred to as "the fourth N-type transistor" hereinafter) N4 includes a source electrode connected with the low voltage source VSS, a drain electrode connected with the second connection node FG1, and a gate electrode connected with the output terminal of the inverter INV1.

In FIG. 1, respective gates of transistors N1, N2, N3, N4, P1, P2 and P3 have an equal gate length of 1.4 $\mu$m and gate widths of 50 $\mu$m, 20 $\mu$m, 5 $\mu$m, 15 $\mu$m, 40 $\mu$m, 4 $\mu$m and 4 $\mu$m in the above order. Furthermore, respective gates of the PMOS type transistor and the NMOS type transistor have gate widths of 15 $\mu$m and 3 $\mu$m when these transistors constitute the decoder NOR, while respective gates of the same have gate widths of 10 $\mu$m and 3 $\mu$m when these transistors constitute the inverter INV1. In this figure, a plurality of actual word lines WL are represented by a word line model shown in the form of a rectangular box, by taking account of the floating capacity and others.

(Operation)

According to the circuit structure of the voltage translator as described in the above, it becomes possible to speedily switch the word line WL to the low voltage VSS by means of a signal instructing the non-selection process. Then, for better understanding, the selection process of the word line WL will be first described before explaining the non-selection process of switching the word line WL to the low voltage state.

The operation voltage VX of the voltage translator is allowed to be set in the range between the high voltage equal to or more than the absolute value of the threshold voltage of the PMOS type transistor and that which is lower than the withstand voltage of the transistor. However, as it is here assumed that the word line selection is carried out for the purpose of the data read operation, let the voltage VX be at 5.5V, the low voltage VSS be substantially at the earth potential (0V), and the logical control voltage VDD be set at 2.6V, respectively.

1-1: The Selection Process

The selection signal i.e. the decode signal SEL being set at a logically low level "L," the output level of the decoder NOR becomes a logically high level "H." The inverter INV1 of the voltage translator 10 receives this signal and outputs a logical selection signal of "L" level.

The logical selection signal becoming "L" level, the first N-type transistor N1 and the fourth N-type transistor N4 are turned off equally. The first N-type transistor N1 being turned off, the word line WL are separated from the earth potential. The fourth N-type transistor N4 being turned off, the second connection node FG1 is separated from the earth potential.

Furthermore, the first connection node PG1 becoming the earth potential through the second N-type transistor N2, the first P-type transistor is turned on, so that the voltage of the word line WL is going up. Still further, as the first connection node PG1 and the gate electrode of the third P-type transistor P3 become equally the earth potential, this P-type transistor P3 is turned on.

With increase in the voltage of the word line WL, the third N-type transistor N3 is turned on. The voltage obtained by subtracting the threshold voltage of the third N-type transistor N3 from the operation voltage VX, is applied to the gate electrode of the second P-type transistor P2, so that the second P-type transistor P2 approaches the off-state thereof as the voltage of the word line WL is increased.

In this way, the word line WL finally goes up to the operation voltage VX and is stabilized at that voltage. Also, the second connection node FG1 finally reaches the operation voltage VX through the third P-type transistor P3 staying in the on-state, and the second P-type transistor P2 gets in the complete off-state.

In the state as described above, each of the second N-type transistor N2, the third N-type transistor N3, the first P-type transistor P1 and the third P-type transistor P3 stays in the on-state. On one hand, each of the first N-type transistor N1, the fourth N-type transistor N4 and the second P-type transistor P rests in the off-state.

1-2: The Non-Selection Process

The logical level of the selection signal i.e. the decode signal SEL being changed from the level "L" to the level "H," the output level of the decoder NOR becomes a logically low level "L." The inverter INV1 of the voltage translator 10 receives this signal and outputs a logical selection signal of "H" level.

The logical selection signal becoming "H" level, the first N-type transistor N1 and the fourth N-type transistor N4 are turned on equally. The first N-type transistor N1 being turned on, the voltage of the word line WL begins to go down. With this fall of the word line voltage, the third N-type transistor N3 connected with the word line WL through the gate thereof is turned off. With this, the second connection node FG1 is separated from the operation voltage source VX and goes down to the earth potential through the fourth N-type transistor N4. With the voltage drop of the second connection point FG1, the second P-type transistor P2 is turned on, by which the operation voltage source VX is connected with the first connection point PG1. Consequently, as the operation voltage VX comes to be applied to respective gates of the first P-type transistor P1 and the third P-type transistor P3, these transistors P1 and P3 comes in the sufficient off-state. As the result of this, the word line WL becomes the earth potential finally.

The second N-type transistor N2 functions as a circuit protector for protecting a circuit driven by the logical control voltage VDD from the operation voltage source VX. Especially, when the first connection node PG1 is at the operation voltage VX, the gate electrode of the second N-type transistor N2 and the electrode of the same connected with the output terminal of the inverter INV1 are at the logical control voltage VDD. At this time, the above transistor N2 functions as a diode preventing the operation voltage VX from being transmitted to the inverter INV1 side.

(Comparison Result)

Figure 2:
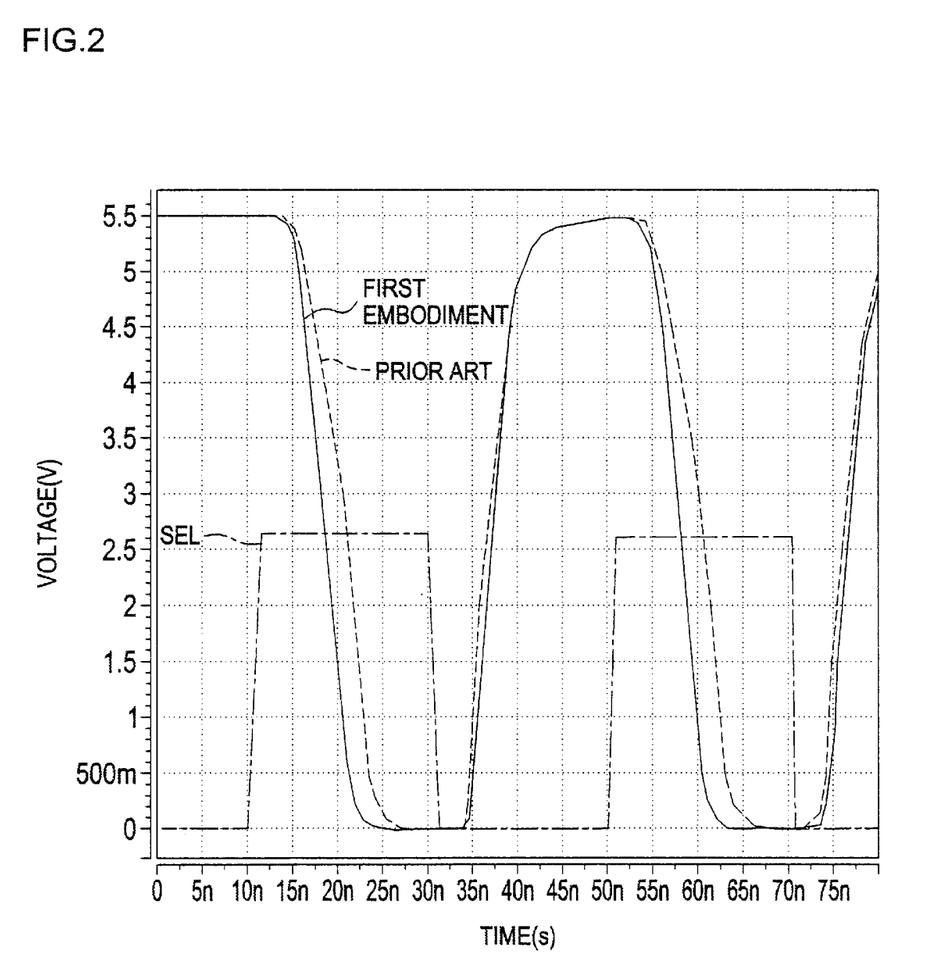
FIG. 2 is a graphical representation showing a word line voltage change with the passage of time in the first embodiment of the invention.
Figure 3:
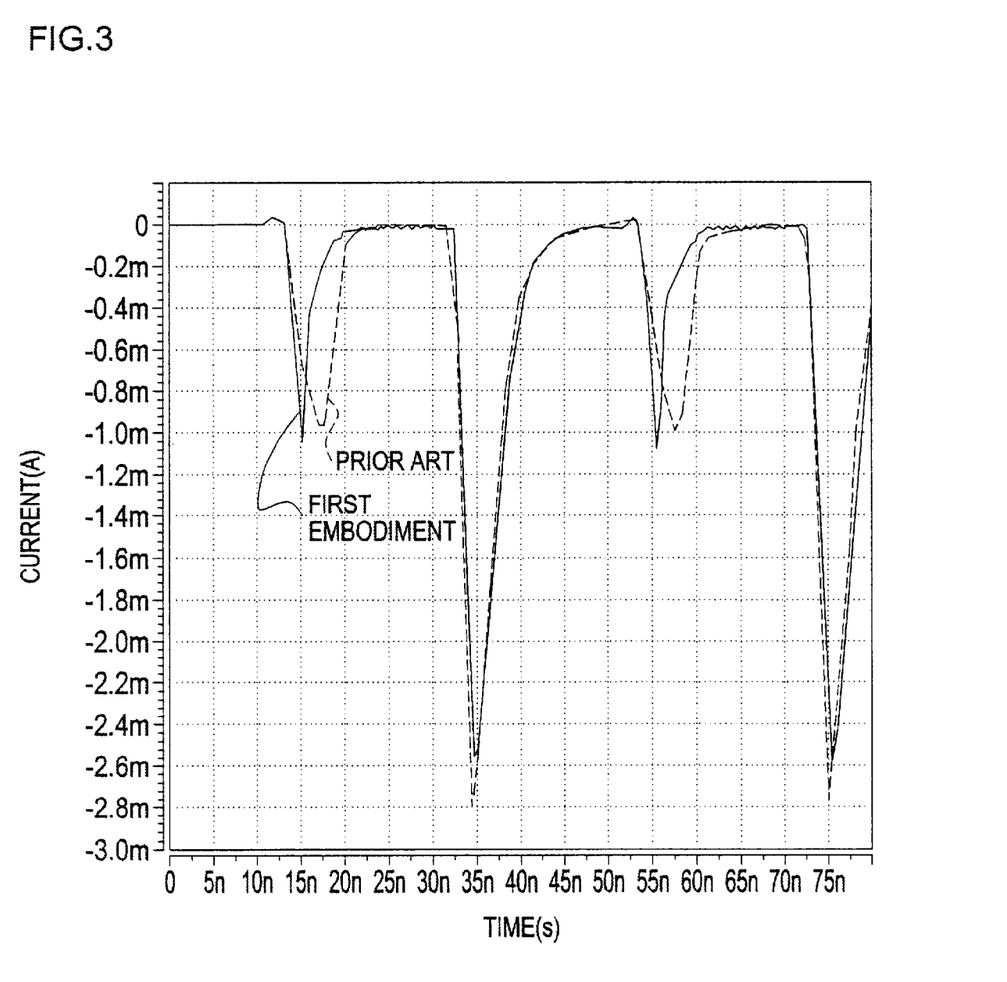
FIG. 3 is a graphical representation showing a penetration current change with the passage of time in the first embodiment of the invention.
Figure 4:
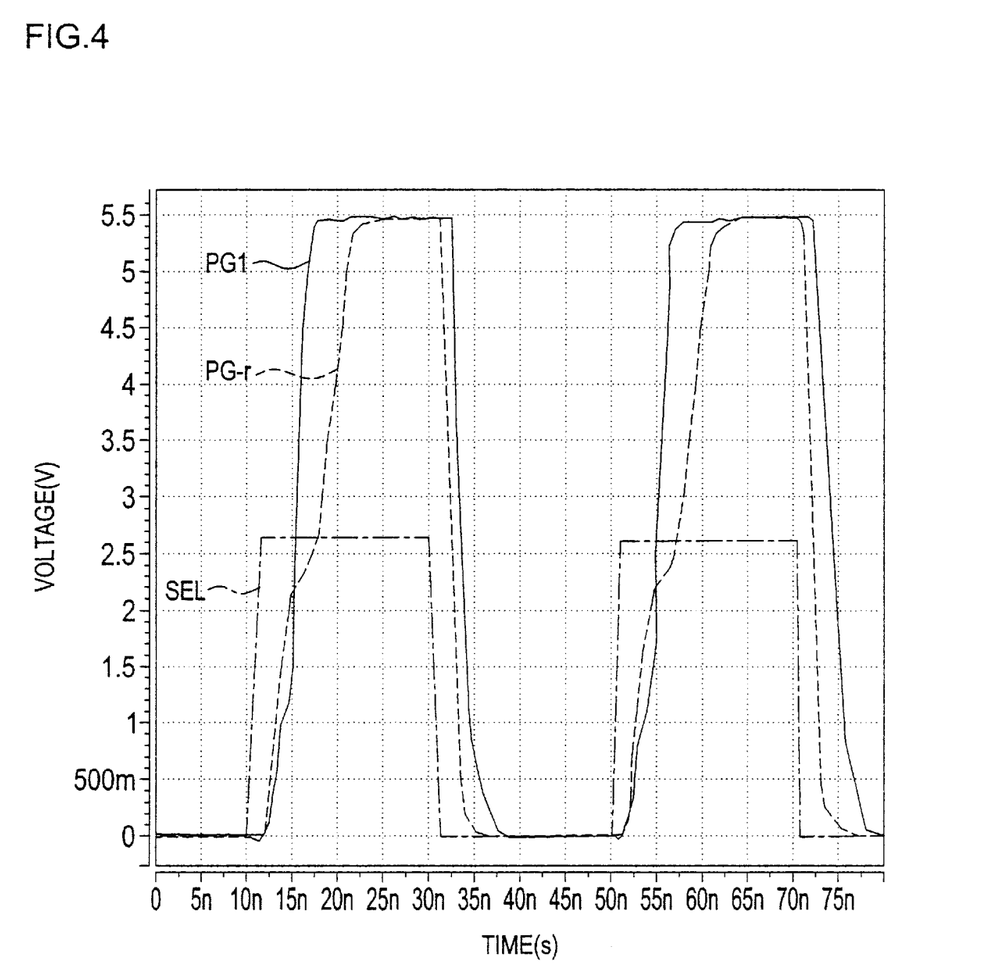
FIG. 4 is a graphical representation showing the voltage change with the passage of time at the first connection node PG1 in the first embodiment of the invention.

FIGS. 2 through 4 are graphical representations showing the simulation results of the circuit operation obtained by means of the SPICE (Simulation Program Integrated Circuit Especially), with regard to the voltage translator according to the first embodiment of the invention.

In each of the above figures, the simulation result with regard to the first embodiment of the invention is indicated by means of a solid line while the simulation result of the prior art circuit as shown in FIG. 9 is indicated by means of a dotted line for comparison. The comparison between the circuit according to the first embodiment of the invention and the prior art circuit is carried out under the very identical condition using the SPICE parameters in the identical process, that is, using the threshold value, Gm, the gate capacity and so forth as the simulation parameters.

FIG. 2 is a graphical representation showing the word line voltage change with the passage of time, in which the horizontal axis (abscissa) indicates the time (unit: second (s)) and the vertical axis (ordinate) indicates the voltage (unit: volt (V)). FIG. 2 further includes a rectangular wave form (one dot chain line) by which the timing of the decode signal SEL instructing the selection or the non-selection can be referred to. In FIG. 2, the selection process and the non-selection process are repeated two times each. At the time 10 ns, the decoder signal SEL is switched from "L" level to "H" level. The voltage translator according to the first embodiment and the prior art one equally begins to decrease the voltage of the word line WL at the time of around 15 ns, but the falling speed of the word line voltage in the former is faster than that in the latter. That is, the voltage translator according to the first embodiment has a high speed non-selection switching time characteristic. The falling time of the word line voltage in the voltage translator of the first embodiment is 7 ns or so.

FIG. 3 is a graph showing the change with the passage of time of the penetration current, in which the horizontal axis (abscissa) indicates the time (unit: second (s)) and the vertical axis (ordinate) indicates the penetration current (unit: current (A)). The penetration current means the current flowing at the switching time of the first N-type transistor N1 and the first P-type transistor P1 (a kind of an inverter is constituted with these transistors). According to the first embodiment, the penetration current in the nonselection process is reduced comparing with the prior art circuit. Especially, when comparing the first embodiment with the prior art circuit with respect to the total amount of the penetration current, that is, the amount of the penetration electric charge, the amount of current reduction is remarkable.

FIG. 4 shows the voltage change with the passage of time at the connection node PG-r of the prior art circuit (FIG. 9 and the first connection node PG1 in the first embodiment of the invention. In this figure, the horizontal axis (abscissa) indicates the time (unit: second (s)) and the vertical axis (ordinate) indicates the voltage (unit: volt (V)). FIG. 4 further includes a rectangular wave form of the decode signal SEL instructing the selection process or the nonselection process. The decoder signal SEL being changed over from "L" level to "H" level, the connection nodes PG-r and the first connection node PG-1 begins to raise respective voltages thereof. The connection node PG-r quickly raises its voltage up to the time of around 15 ns but thereafter, the rising speed of the voltage is once dropped for a certain period of time, in other words, the rising curve of the voltage comes to draw a step portion on the way thereof.

In contrast to this, the first connection node PG1 smoothly rises up to the operation voltage VX in a short period of time. Consequently, the high speed rising of the first connection node PG1 contributes to improvement of the non-selection switching time characteristic and reduction in the penetration current as well.

[Second Embodiment]

(Constitution)

Figure 5:
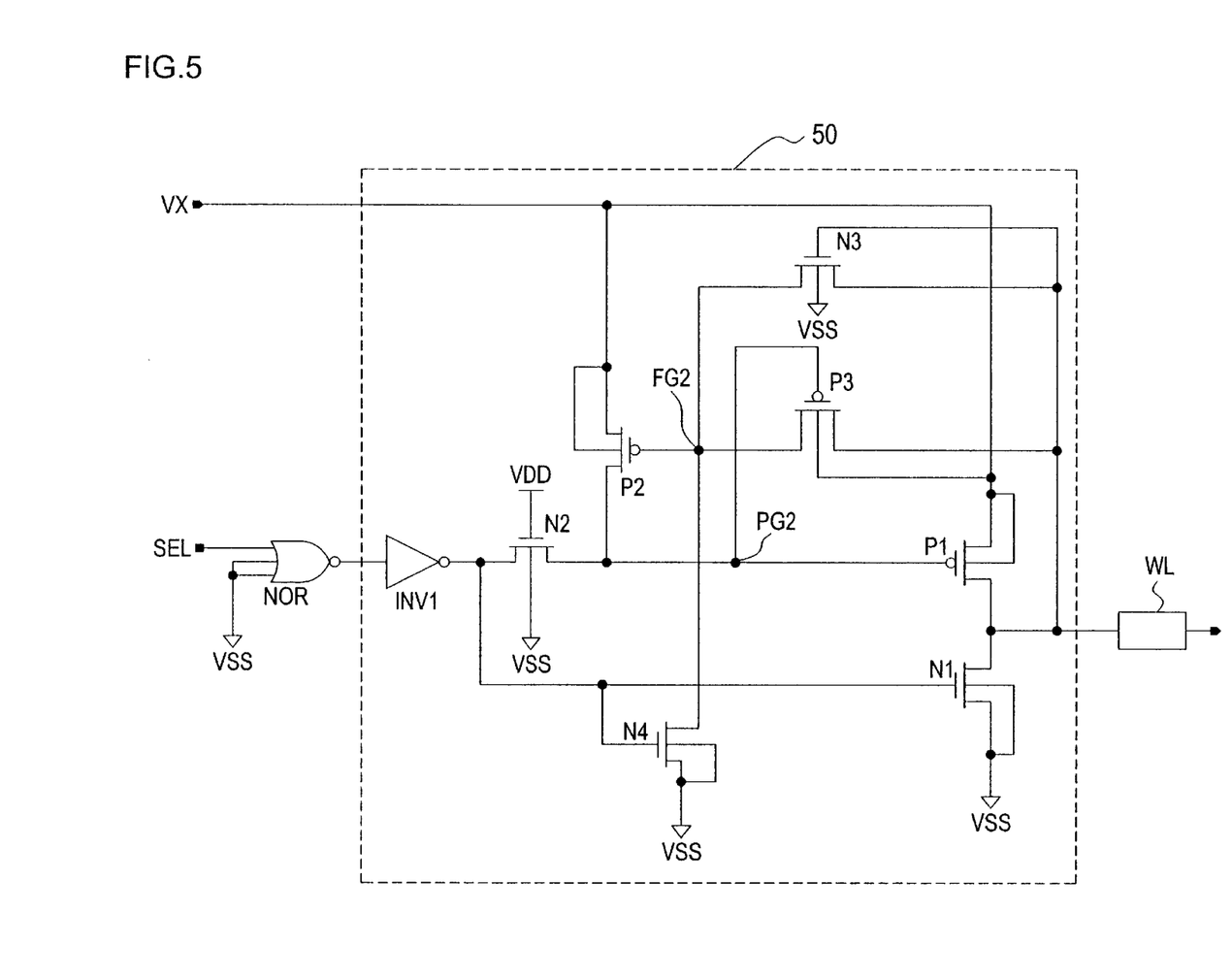
FIG. 5 is a circuit diagram of a voltage translator according to the second embodiment of the invention.

FIG. 5 is a circuit diagram of the voltage translator arranged according to the second preferred embodiment of the invention.

A voltage translator 50 is connected with an operation voltage source VX generating the high voltage and also with a low voltage source VSS generating the lower voltage, and supplies either the high voltage or the lower one to the word line WL. Changeover from the selection process voltage to the non-selection process or vice versa is carried out by means of a decode signal SEL. The decode signal SEL is inputted to the voltage translator 50 through a decoder typically shown in the form of a NOR gate NOR in FIG. 5.

The output terminal of the decoder NOR is connected with the input terminal of the inverter INV1. The decode signal SEL has the inverter INV1 generated a logical selection signal at the output terminal thereof.

This logical selection signal is inputted to the gate electrode of the first NMOS type transistor (referred to as "the first N-type transistor" hereinafter) N1, of which the source and drain electrodes are connected with the low voltage source VSS and the word line WL, respectively. The second NMOS type transistor (referred to as "the second N-type transistor" hereinafter) N2 includes a source electrode connected with the output terminal of the inverter INV1, a drain electrode connected with the gate electrode of the first PMOS type transistor (referred to as "the first P-type transistor" hereinafter) P1 which will be described later, and a gate electrode connected with a logical control voltage source VDD.

Furthermore, the word line WL is connected with the low voltage source VSS via the first N-type transistor N1, and is also connected with the operation voltage source VX via the first P-type transistor P1. In other words, the drain electrode of the first P-type transistor P1 is connected with the word line WL while the source electrode of the same is connected with the operation voltage source VX.

Here, the junction point made by the drain electrode of the second N-type transistor N2 and the gate electrode of the first P-type transistor P1 is referred to as "the first connection node" and is indicated by a reference mark 'PG2' in FIG. 5.

The second PMOS type transistor (referred to as "the second P-type transistor" hereinafter) P2 includes a source electrode connected with the operation voltage source VX and a drain electrode connected with the first connection node PG2.

The third NMOS type transistor (referred to as "the third N-type transistor" hereinafter) N3 includes a source electrode connected with the gate electrode of the second P-type transistor P2, a drain electrode connected with the word line WL, and a gate electrode connected also with the word line WL.

Here again, the junction point made by the gate electrode of the second P-type transistor P2 and the source electrode of the third N-type transistor N3 is referred to as "the second connection node" and is indicated by a reference mark 'FG2' in FIG. 5.

The third PMOS type transistor (referred to as "the third P-type transistor" hereinafter) P3 includes a source electrode connected with the second connection node FG2, a drain electrode connected with the word line WL, and a gate electrode connected with the first connection node PG2.

The fourth NMOS type transistor (referred to as "the fourth N-type transistor" hereinafter) N4 includes a source electrode connected with the low voltage source VSS, a drain electrode connected with the second connection node FG2, and a gate electrode connected with the output terminal of the inverter INV1.

In FIG. 5, respective gates of transistors N1, N2, N3, N4, P1, P2 and P3 have a equal gate length of 1.4 $\mu$m and gate widths of 50 $\mu$m, 20 $\mu$m, 5 $\mu$m, 15 $\mu$m, 40 $\mu$m, 4 $\mu$m and 4 $\mu$m in the above order. Still further, respective gates of the PMOS type transistor and the NMOS type transistor have gate widths of 15 $\mu$m and 3 $\mu$m when these transistors constitutes the decoder NOR, while respective gates of the same have gate widths of 10 $\mu$m and 3 $\mu$m when they constitute the inverter INV1. In this figure, a plurality of actual word lines WL are represented by a word line model shown in the form of a rectangular box, by taking account of the floating capacity and others.

As described above, the different point between the circuit structures of the voltage translator according to the first and second embodiments of the invention is that the drain of the third N-type transistor N3 is connected with the operation voltage VX in the first embodiment while it is connected with the word line WL in the second embodiment.

(Operation)

With the circuit structure of the voltage translator according to the invention as described in the above, it becomes possible to speedily switch the voltage of the word line WL to the low voltage VSS by means of the signal instructing the non-selection process. Then, for better understanding, the selection process of the word line WL will be first described before explaining the non-selection process of the word line WL.

The operation voltage VX of the voltage translator is allowed to be set in the range between the high voltage equal to or more than the absolute value of the threshold voltage of the PMOS type transistor and that which is lower than the withstand voltage of the transistor. However, as it is here assumed that the word line selection is carried out for the purpose of the data read operation, let the voltage VX be at 5.5V, the low voltage VSS be substantially at the earth potential (0V), and the logical control voltage VDD be at 2.6V, respectively.

2-1: The Selection Process

The selection signal i.e. the decode signal SEL being set at a logically low level "L," the output level of the decoder NOR becomes a logically high level "H." The inverter INV1 of the voltage translator 50 receives this signal and outputs a logical selection signal of "L" level.

The logical selection signal becoming "L" level, the first N-type transistor N1 and the fourth N-type transistor N4 are turned off equally. The first N-type transistor N1 being turned off, the word line WL are separated from the earth potential. The fourth N-type transistor N4 being turned off, the second connection node FG2 is separated from the earth potential.

Furthermore, the first connection node PG2 becoming the earth potential through the second N-type transistor N2, the first P-type transistor P1 is turned on, so that the voltage of the word line WL is going up. Still further, as the first connection node PG2 and the gate electrode of the third P-type transistor P3 become equally the earth potential, this P-type transistor P3 is turned on.

With increase in the voltage of the word line WL, the third N-type transistor N3 is turned on. The voltage obtained by subtracting the threshold voltage of the third N-type transistor N3 from the voltage of the word line WL, is applied to the gate electrode of the second P-type transistor P2, so that the second P-type transistor P2 approaches the off-state thereof as the voltage of the word line WL is increased.

In this way, the word line WL finally goes up to the operation voltage VX and is stabilized at that voltage. Also, the second connection node FG2 finally reaches the operation voltage VX through the third P-type transistor P3 finally getting in the on-state, and the second P-type transistor P2 gets in the complete off-state.

In the state as described above, each of the second N-type transistor N2, the third N-type transistor N3, the first P-type transistor P1 and the third P-type transistor P3 stays in the on-state while each of the first N-type transistor N1, the fourth N-type transistor N4 and the second P-type transistor P rests in the off-state.

2-2: The Non-Selection Process

The logical level of the selection signal i.e. the decode signal SEL being changed from the level "L" to the level "H," the output level of the decoder NOR becomes a logically low level "L." The inverter INV1 of the voltage translator 50 receives this signal and outputs a logical selection signal of "H" level.

The logical selection signal becoming "H" level, the first N-type transistor N1 and the fourth N-type transistor N4 are turned on equally. The first N-type transistor N1 being turned on, the voltage of the word line WL begins to go down. With this fall of the word line voltage, the third N-type transistor N3 connected with the word line WL through the gate thereof is turned off. With this, the second connection node FG2 is separated from the operation voltage source VX and goes down to the earth potential through the fourth N-type transistor N4. With the voltage drop of the second connection point FG2, the second P-type transistor P2 is turned on, by which the operation voltage source VX is connected with the first connection point PG2. Consequently, as the operation voltage VX comes to be applied to respective gates of the first P-type transistor P1 and the third P-type transistor P3, these transistors P1 and P3 comes in the sufficient off-state. As the result of this, the word line WL becomes the earth potential, finally.

The second N-type transistor N2 functions as a circuit protector for protecting a circuit driven by the logical control voltage VDD from the operation voltage source VX. Especially, when the first connection node PG2 is at the operation voltage VX, the gate electrode of the second N-type transistor N2 and the electrode of the same connected with the output side of the inverter INV1 are at the logical control voltage VDD. At this time, the above transistor N2 functions as a diode preventing the operation voltage VX from being transmitted to the inverter INV1 side.

(Comparison Result)

Figure 6:
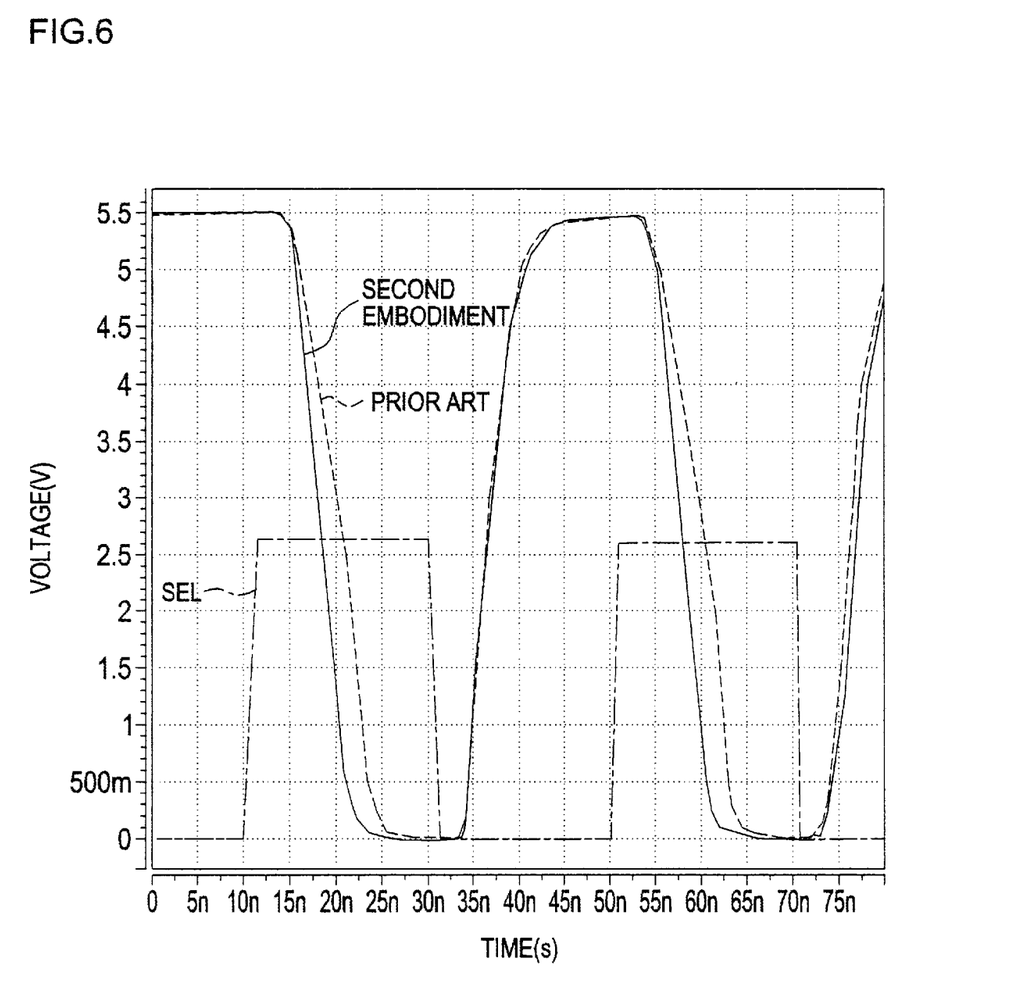
FIG. 6 is a graphical representation showing a word line voltage change with the passage of time in the second embodiment of the invention.
Figure 7:
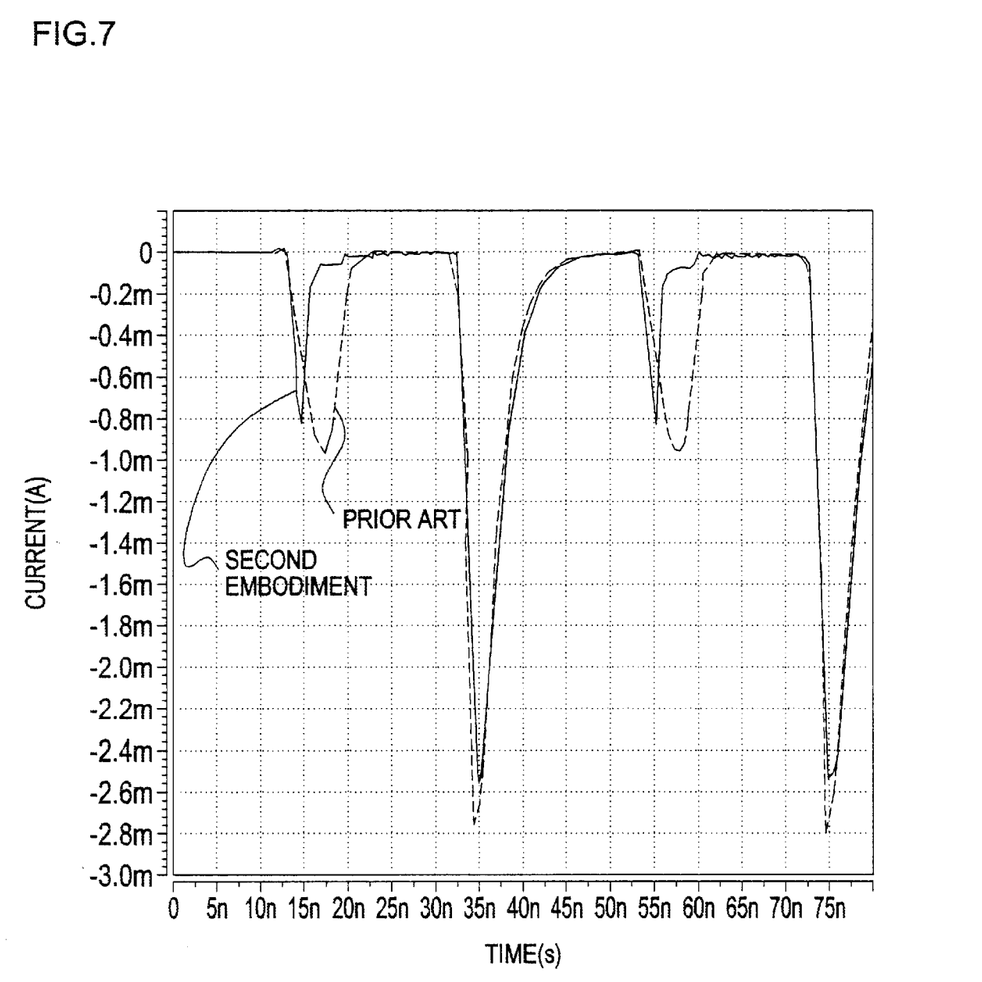
FIG. 7 is a graphical representation showing a penetration current change with the passage of time in the second embodiment of the invention.
Figure 8:
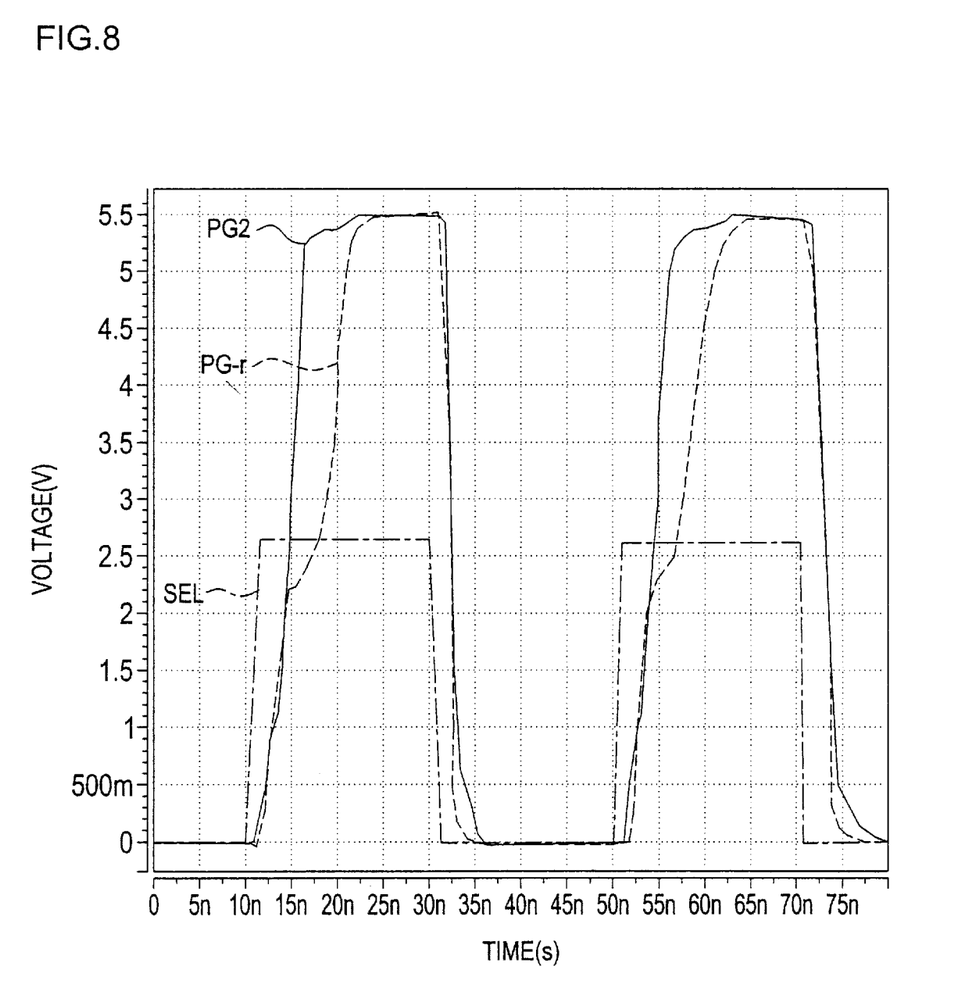
FIG. 8 is a graphical representation showing the voltage change with the passage of time at the first connection node PG2 in the second embodiment of the invention.

FIGS. 6 through 8 are graphical representations showing the simulation results of the circuit operation obtained by means of the SPICE (Simulation Program Integrated Circuit Especially), with regard to the voltage translator according to the second embodiment of the invention.

In each of the above figures, the simulation result with regard to the second embodiment of the invention is indicated by means of a solid line while the simulation result of the prior art circuit as shown in FIG. 9 is indicated by means of a dotted line for comparison. The comparison between the circuit according to the second embodiment of the invention and the prior art circuit is carried out under the very identical condition using the SPICE parameters of the identical process, that is, using the threshold value, Gm, the gate capacity and so forth as the simulation parameter.

FIG. 6 is a graphical representation showing the word line voltage change with the passage of time, in which the horizontal axis (abscissa) indicates the time (unit: second (s)) and the vertical axis (ordinate) indicates the voltage (unit: volt (V)). FIG. 6 further includes a rectangular wave form (one dot chain line) by which the timing of the decode signal SEL instructing the selection process or the non-selection process can be referred to. In FIG. 6, the selection process and the non-selection process are repeated two times each. At the time 10 ns, the decoder signal SEL is switched from "L" level to "H" level. The voltage translators according to the second embodiment and the prior art one equally begin to decrease the voltage of the word line WL at the time of around 15 ns, but the falling speed of the word line voltage in the former is faster than that in the latter. That is, the voltage translator according to the second embodiment has a high speed non-selection switching time characteristic. The falling time of the word line voltage in the voltage translator of the second embodiment is 7 ns or so.

FIG. 7 is a graph showing the change of the penetration current with the passage of time, in which the horizontal axis (abscissa) indicates the time (unit: second (s)) and the vertical axis (ordinate) indicates the penetration current (unit: current (A)). The penetration current means the current flowing at the switching time of the first N-type transistor N1 and the first P-type transistor P1 (a kind of an inverter is constituted with these transistors). According to the second embodiment, the penetration current flowing at the time of the non-selection switching is reduced comparing with the prior art circuit. Especially, when comparing the second embodiment with the prior art circuit with respect to the total amount of the penetration current, that is, the amount of the penetration electric charge, the amount of current reduction is remarkable.

FIG. 8 shows the voltage change with the passage of time at the connection node PG-r of the prior art circuit (FIG. 9) and the first connection node PG2 in the second embodiment of the invention. In this figure, the horizontal axis (abscissa) indicates the time (unit: second (s)) and the vertical axis (ordinate) indicates the voltage (unit: volt (V)). FIG. 8 further includes a rectangular wave form of the decode signal SEL instructing the selection process or the non-selection process. The decoder signal SEL being changed over from "L" level to "H" level, the connection nodes PG-r and the first connection node PG2 begins to raise respective voltages thereof. The connection node PG-r quickly raises the voltage thereof up to the time of around 15 ns but thereafter, the voltage rising speed is once dropped for a certain period of time, in other words, the voltage rising curve comes to draw a step portion on the way thereof.

In contrast to this, the first connection node PG2 smoothly rises up to the operation voltage VX in a short period of time. As a result, this high speed rising of the first connection node PG2 contributes to improvement of the non-selection switching time characteristic and reduction in the penetration current as well.

In the next, let us compare this second embodiment with the first one as described previously. In order to speedily switch the voltage of the word line WL to the non-selection state, it is needed to switch the gate voltage FG of the second P-type transistor P2 as quickly as possible. In the second embodiment, as the drain electrode of the third N-type transistor N3 is connected with word line WL, this transistor N3 is retained in the on-state all the time while the word line WL is switched from the operation voltage VX to the earth potential. Thus, there become available two kinds of transition paths allowing the operation voltage VX of the second connection node FG2 to drop into the earth potential, in other words, the transition path allowing the positive electric charges charged up on the second connection node FG2 to drop into the earth potential. The first path is a path passing through the fourth N-type transistor N4, which is the same as one in the first embodiment, and the second path is a path passing through the third N-type transistor N3 and the first N-type transistor.

Because of this, the voltage translator according to the second embodiment is much improved comparing the voltage translator according to the first embodiment, with respect to the non-selection switching time characteristic of the word line WL and the penetration current as well.

Although preferred embodiments of the invention have been shown and discussed, there is possibility that the performance of the transistor, for instance switching speed and so forth might be further advanced due to the improvement and development of the semiconductor manufacturing process. Accordingly, the numerical values as have been used so far in the above description are not definitive but illustrative to the last. Furthermore, it is apparent that the application of the invention to the bipolar transistor and the SOI technology can be thought of with ease by those skilled in the art.

As has been discussed in detail, according to the invention, there can be provided a voltage translator characterized by the high speed non-selection switching time characteristic.

As will be understood from the simulation results described in the above, the falling of the word line voltage has a speedy non-selection switching time characteristic. Also, the falling time of the word line voltage is almost identical to the rising time of the word line voltage. Therefore, the switching operation for memory selection can be made much more speedy.

Still further, according to the invention, there can be obtained such an effect that the penetration current caused at the time of non-selection switching is remarkably reduced.

While certain preferred embodiments have been chosen to illustrate and describe the invention, it will be understood by those skilled in the art that various changes and modifications can be made therein without departing from the scope of the invention as defined in the appended claims.

What is claimed is:

1. A voltage translator supplying either an operation voltage from an operation voltage source or a low voltage from a low voltage source to a word line, in response to a decode signal, comprising:

an inverter generating a logical selection signal based on said decode signal;

a first NMOS type transistor including a source electrode connected with said low voltage source, a drain electrode connected with said word line, and a gate electrode connected with the output terminal of said inverter;

a first PMOS type transistor including a source electrode connected with said operation voltage source, and a drain electrode connected with said word line;

a second PMOS type transistor including a source electrode connected with the operation voltage source, and a drain electrode connected with the gate of said first PMOS type transistor;

a second NMOS type transistor including the source electrode connected with the gate electrode of said second PMOS type transistor, a drain electrode connected with said operation voltage source, and a gate electrode connected with said word line;

a third PMOS type transistor including a source electrode connected with the gate electrode of said second PMOS type transistor and also with the source electrode of said third NMOS transistor, a drain electrode connected with said word line, and a gate electrode connected with the gate electrode of said first PMOS type transistor; and a third NMOS type transistor including a source electrode connected with said low voltage source, a drain electrode connected with the gate electrode of said second PMOS type transistor, and a gate electrode connected with the output terminal of said inverter.

2. A voltage translator as claimed in claim 1, wherein said decode signal is inputted to the voltage translator through a decoder made up of a NOR gate.

3. A voltage translator as claimed in claim 1, wherein said operation voltage is set at around 5.5 volt while said low voltage is set substantially at the earth potential.

4. A voltage translator supplying either an operation voltage from an operation voltage source or a low voltage from a low voltage source to a word line, in response to a decode signal, comprising:

an inverter generating a logical selection signal based on said decode signal;

a first NMOS type transistor including a source electrode connected with said low voltage source, a drain electrode connected with said word line, and a gate electrode connected with the output terminal of said inverter;

a first PMOS type; transistor including a source electrode connected with said operation voltage source, and a drain electrode connected with said word line;

a second NMOS type transistor including a source electrode connected with the output terminal of said inverter, a drain electrode connected with gate electrode of said first PMOS type transistor, and a gate electrode connected with a logical control voltage source;

a second PMOS type transistor including a source electrode connected with said operation voltage source, and a drain electrode connected with the gate of said first PMOS type transistor;

a third NMOS type transistor including a source electrode connected with the gate electrode of said second PMOS type transistor, a drain electrode connected with said operation voltage source, and a gate electrode connected with said word line;

a third PMOS type transistor including a source electrode connected with the gate electrode of said second PMOS type transistor and also with the source electrode of said third NMOS transistor, a drain electrode connected with said word line, and a gate electrode connected with the gate electrode of said first PMOS type transistor; and a fourth NMOS type transistor including a source electrode connected with said low voltage source, a drain electrode connected with the gate electrode of said second PMOS type transistor, and a gate electrode connected with the output terminal of said inverter.

5. A voltage translator as claimed in claim 4, wherein said decode signal is inputted to the voltage translator through a decoder made up of a NOR gate.

6. A voltage translator as claimed in claim 4, wherein said operation voltage is set at around 5.5 volt, said low voltage is set substantially at the earth potential, and said logical control voltage is set at around 2.6 volt.

7. A voltage translator supplying either an operation voltage from an operation voltage source or an low voltage from a low voltage source to a word line, in response to a decode signal, comprising:

an inverter generating a logical selection signal based on said decode signal;

a first NMOS type transistor including a source electrode connected with said low voltage source, a drain electrode connected with said word line, arid a gate electrode connected with the output terminal of said inverter;

a first PMOS type transistor including a source electrode connected with said operation voltage source, and a drain electrode connected with said word line;

a second NMOS type transistor including a source electrode connected with the output terminal of said inverter, a drain electrode connected with gate electrode of said first PMOS type transistor, and a gate electrode connected with a logical control voltage source;

a second PMOS type transistor including a source electrode connected with said operation voltage source, and a drain electrode connected with the gate of said first PMOS type transistor;

a third NMOS type transistor including a source electrode connected with the gate electrode of said second PMOS type transistor, a drain electrode connected with said word line, and a gate electrode connected with said word line;

a third PMOS type transistor including a source electrode connected with the gate electrode of said second PMOS type transistor and also with the source electrode of said third NMOS transistor, a drain electrode connected with said word line, and a gate electrode connected with the gate electrode of said first PMOS type transistor; and a fourth NMOS type transistor including a source electrode connected with said low voltage source, a drain electrode connected with the gate electrode of said second PMOS type transistor, and a gate electrode connected with the output terminal of said inverter.

8. A voltage translator as claimed in claim 7, wherein said decode signal is inputted to the voltage translator through a decoder made up of a NOR gate.

9. A voltage translator as claimed in claim 7, wherein said operation voltage is set at around 5.5 volt, said low voltage is set substantially at the earth potential, and said logical control voltage is set at around 2.6 volt.

10. A voltage translator supplying either an operation voltage from an operation voltage source or a low voltage from a low voltage source to a word line, in response to a decode signal, comprising:

an inverter generating a logical selection signal based on said decode signal;

a first NMOS type transistor including a source electrode connected with said low voltage source, a drain electrode connected with said word line, and a gate electrode connected with the output terminal of said inverter;

a first PMOS type transistor including a source electrode connected with said operation voltage source, and a drain electrode connected with said word line;

a second PMOS type transistor including a source electrode connected with the operation voltage source, and a drain electrode connected with the gate of said first PMOS type transistor;

a control circuit which controls a conduction state of said second PMOS type transistor in response to a voltage on said word line, wherein the control circuit includes a third NMOS transistor;

a third PMOS type transistor including a source electrode connected with the gate electrode of said second PMOS type transistor and also with the source electrode of said third NMOS transistor, a drain electrode connected with said word line, and a gate electrode connected with the gate electrode of said first PMOS type transistor, and a fourth NMOS type transistor including a source electrode connected with said low voltage source, a drain electrode connected with the gate electrode of said second PMOS type transistor, and a gate electrode connected with the output terminal of said inverter.

11. A voltage translator as claimed in claim 10, wherein said decode signal is input to the voltage translator through a decoder comprising a NOR gate.

12. A voltage translator as claimed in claim 10, wherein said operation voltage is set at approximately 5.5 volt while said low voltage is set substantially at ground.

13. A voltage translator supplying either an operation voltage from an operation voltage source or a low voltage from a low voltage source to a word line, in response to a decode signal, comprising:

an inverter generating a logical selection signal based on the decode signal;

a first NMOS type transistor including a source electrode connected with the low voltage source, a drain electrode a drain electrode connected with the word line, and a gate electrode connected with an output terminal of said inverter;

a first PMOS type transistor including a source electrode connected with the operation voltage source, and a drain electrode connected with the word line;

a second PMOS type transistor including a source electrode connected with the operation voltage source, and a drain electrode connected with a gate of said first PMOS type transistor;

a second NMOS type transistor including a source electrode connected with a gate electrode of said second PMOS type transistor, a drain electrode connected with the word line, and a gate electrode connected with the word line;

a third PMOS type transistor including a source electrode connected with said gate electrode of said second PMOS type transistor and also with said source electrode of said second NMOS type transistor, a drain electrode connected with the word line, and a gate electrode connected with said gate electrode of said first PMOS type transistor; and a third NMOS type transistor including a source electrode connected with the low voltage source, a drain electrode connected with said gate electrode of said second PMOS type transistor, and a gate electrode connected with said output terminal of said inverter.

14. A voltage translator as claimed in claim 13, wherein said decode signal is input to the voltage translator through a decoder comprising a NOR gate.

15. A voltage translator as claimed in claim 13, wherein said operation voltage is set at approximately 5.5 volt while said low voltage is set substantially at ground.

* * * * *